United States Patent [19]
Watson et al.

[11] Patent Number: 5,617,294
[45] Date of Patent: Apr. 1, 1997

[54] APPARATUS FOR REMOVING HEAT FROM AN INTEGRATED CIRCUIT PACKAGE THAT IS ATTACHED TO A PRINTED CIRCUIT BOARD

[75] Inventors: Jeff R. Watson; Michael N. Goetsch, both of Phoenix, Ariz.; Jim V. Noval; Raiyo F. Aspandiar, both of Portland, Oreg.

[73] Assignee: Intel Corporation, Santa Clara, Calif.

[21] Appl. No.: 535,974

[22] Filed: Sep. 29, 1995

[51] Int. Cl.⁶ ...................................................... H05K 7/20
[52] U.S. Cl. ........................ 361/719; 174/16.3; 361/704
[58] Field of Search ................................. 174/16.3, 252; 165/80.3, 185; 257/706, 707, 713, 720; 361/704–707, 709–713, 717–719, 767, 778

[56] References Cited

U.S. PATENT DOCUMENTS

| | | | |
|---|---|---|---|
| 4,046,442 | 9/1977 | Hutchison | 339/17 CF |
| 4,509,096 | 4/1985 | Baldwin | 361/386 |
| 4,598,308 | 7/1986 | James | 357/81 |
| 5,172,301 | 12/1992 | Schneider | 361/386 |
| 5,293,301 | 3/1994 | Tanaka | 361/707 |
| 5,306,670 | 4/1994 | Mowatt | 437/209 |

*Primary Examiner*—Gerald P. Tolin
*Attorney, Agent, or Firm*—Blakely, Sokoloff, Taylor & Zafman

[57] ABSTRACT

An apparatus for removing heat from an integrated circuit package. In one embodiment, the present invention includes a heat slug that is capable of being installed within an opening in a printed circuit board using a standard pick-and-place machine. The surface mountable heat slug includes a top portion and a bottom portion, wherein the bottom portion is formed to fit within the printed circuit board opening. The top portion of the heat slug is attached to the top surface of the printed circuit board. The integrated circuit package is attached to the bottom portion of the heat slug which is exposed along the bottom surface of the printed circuit board.

7 Claims, 4 Drawing Sheets

APPARATUS FOR REMOVING HEAT FROM AN INTEGRATED CIRCUIT PACKAGE THAT IS ATTACHED TO A PRINTED CIRCUIT BOARD

FIELD OF THE INVENTION

The present invention relates to the field of integrated circuits. More particularly, the invention provides a method of surface mounting a heatsink to a printed circuit board.

BACKGROUND OF THE INVENTION

A printed circuit board (PCB) is a composite of organic and inorganic materials with external and internal wiring, allowing electronic components to be mechanically supported and electrically connected. A PCB typically contains multiple insulation layers sandwiched between metal layers. A typical PCB contains at least one metal layer that is patterned to transfer signals between the electronic components, one power plane for distributing voltage throughout the PCB, and one ground plane.

The method and manner in which components are attached to a PCB has changed as integrated circuits and circuit board technology has improved. Today, a significant number of components are surface mounted to the PCB while others have pins soldered into plated-through-holes. In surface-mount technology, the components are soldered directly to the surface of a PCB, in contrast to the through-hole mode in which the component leads are inserted through a PCB. The driving force for the use of surface-mount technology is the reduced package size, improved utilization of board real estate and assembly simplicity.

As integrated circuit technology has improved, substantially greater functionality has been incorporated into the devices. In addition, the portability of computing and information management is driving the reduction in size from desktop to laptop to notebook sized products. Hence, as integrated circuits have expanded in functionality, the size of the devices have diminished resulting in higher clocking frequencies and increased power consumption. As a consequence, the integrated circuit devices of today generate more heat while possessing smaller surface areas to dissipate the heat. To improve thermal efficiency, many package designs today employ additional methods to dissipate heat during the operation of the integrated circuit device. One method includes the use of a heat slug that is coupled to the integrated circuit device package or directly to the integrated circuit device itself. In some applications the use of a heat slug by itself is insufficient because it lacks the thermal mass necessary to remove the heat generated by the electronic device. As a result, additional heat removal devices, such as heat pipes, are being used to supplement the heat removal capacity of the heat slug. Moreover, the manufacturing and assembly costs associated with the current methods of attaching a heat removal apparatus to an integrated circuit package is high.

What is needed then is a method which solves the aforementioned problems associated with removing heat from an integrated circuit device. As will be seen, the present invention provides a low cost method of coupling a heat slug to a PCB and an integrated circuit device using surface mount technology.

SUMMARY OF THE INVENTION

The present invention is an improved method for attaching a heat slug to a PCB using surface mount technology.

The improved method for attaching a heat slug to a PCB is accomplished primarily through the following steps: First, a copper layer is formed around the periphery of an opening in the PCB. In one embodiment, the PCB contains peripheral vias disposed about the opening that are filled with copper. The peripheral vias run through the PCB and connect with the PCB ground and power planes. When formed, the copper layer covers and bonds with the copper filled peripheral vias. Secondly, a Pb/Sn solder paste is applied over the copper layer. Once the solder paste is applied, a heat slug is placed into the opening of the PCB using a standard pick-and-place surface-mount machine. The heat slug has a top portion and a bottom portion wherein a ledge is formed between the two portions. The bottom portion of the heat slug has a slightly smaller surface area and substantially the same shape as the opening in the PCB. After being placed in position by the pick-and-place machine, the heat slug is supported by its ledge which sits atop the previously deposited solder. The bottom portion of the heat slug rests within the PCB opening and limits the lateral movement of the heat slug during the surface mounting process. The connection between the heat slug and PCB is then made by running the PCB through a nitrogen ambient reflow furnace. Thus, the present invention provides a method for coupling a heat slug to a PCB using surface-mount technology.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

The present invention is an improved method for attaching a heat slug to a PCB using surface mount technology.

A method for attaching a heat slug to a PCB using surface mount technology is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 1:
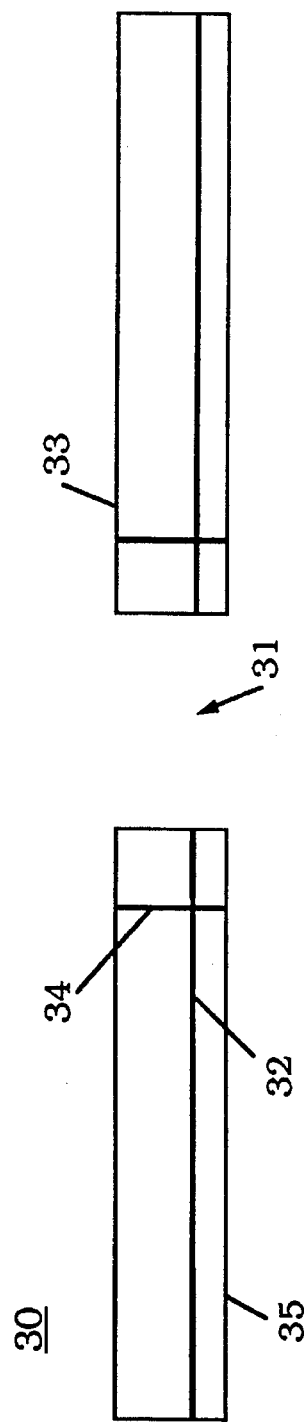
FIG. 1 illustrates the side view of an opening in a PCB having metal filled peripheral vias that connect with an inner layer metal plane.

FIG. 1 illustrates a PCB 30 having an opening 31 with peripheral vias 34 disposed about the opening and running from the top side 33 to the bottom side 35 of PCB 30. The peripheral vias are filled with a conductive metal and are connected to a conductive metal layer 32 that is disposed within PCB 30. Although FIG. 1 illustrates a PCB containing only one conductive layer, it is appreciated that PCB 30 may contain a plurality of conductive layers that are separated by dielectric layers.

Figure 2:
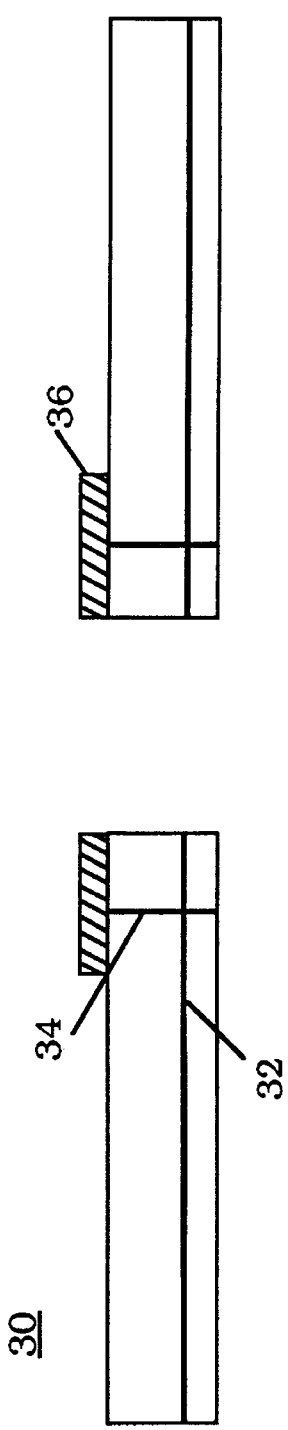
FIG. 2 illustrates the PCB of FIG. 1 after a conductive metal layer is formed around the inner and peripheral surfaces of the PCB opening.

Referring now to FIG. 2, the PCB of FIG. 1 is shown after a metal layer 36 is formed around the periphery of opening 31. As depicted in FIG. 2, metal layer 36 is formed to cover and bond with peripheral vias 34. In one embodiment of the present invention metal layer 36 comprises a copper layer having a thickness of approximately 0.0014 inches. The metal layer may be formed using an electroplating, sputter deposition, or any of a number of other metal formation or bonding processes that are commonly known in the art.

Figure 3:
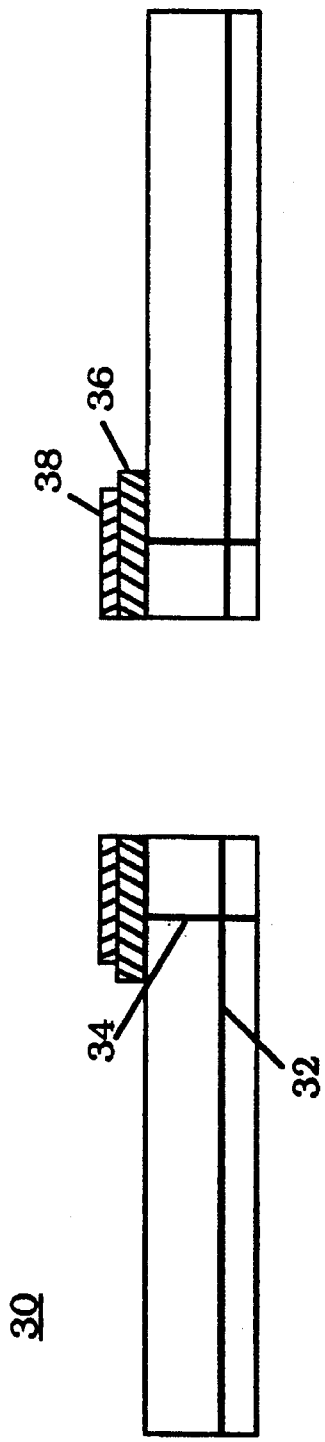
FIG. 3 illustrates the PCB of FIG. 2 after solder is deposited over the metal layer.

Once metal layer 36 is formed, solder paste is applied over the layer. Sn/Pb solder paste is applied to metal layer 36 by using a screen printing process wherein a screen mesh apparatus is positioned over PCB 30 and solder paste is dispensed onto layer 36. FIG. 3 shows a cross-sectional view of the PCB 30 after solder 38 has been applied to metal layer 36.

Figure 4:
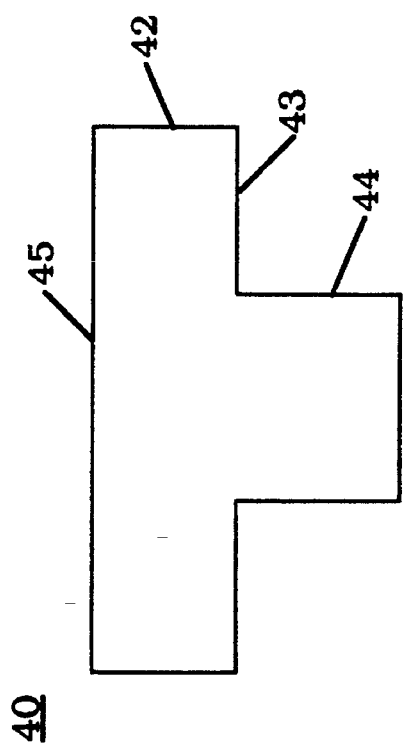
FIG. 4 illustrates a heat slug of one embodiment of the present invention.

The heat slug 40 of the present invention has a top portion 42, a bottom portion 44, and a ledge 43 formed between the two portions. (See FIG. 4.) Heat slug 40 is formed to fit within the opening in a PCB. Hence, the size and shape of heat slug 40 will vary depending upon the size and shape of opening 31. The size of heat slug 40 will also vary depending on the thermal mass requirement of the device. In one embodiment, the bottom portion 44 of heat slug 40 has a slightly smaller surface area and substantially the same shape as the opening in the PCB. Top portion 42 includes a flat surface 45 to facilitate the installation of the heat slug 40 into the opening 31 of PCB 30. Specifically, surface 42 provides a suitable surface for use by a vacuum manipulator on a standard electronic assembly pick-and-place machine. Heat slug 40 is preferably constructed from a thermally conductive material such as a nickel/gold plated copper or anodized aluminum. Heat slug 40 may also be constructed from a material that is both thermally and electrically conductive. Generally, it is desirable to chose a material that possesses a coefficient of thermal expansion similar to that of the PCB.

Heat slug 40 is installed into opening 31 using a standard pick-and-place surface-mount machine that is well known to those of ordinary skill in the art. After being placed in position by the pick-and-place machine, heat slug 40 is supported by ledge 17 which sits atop the previously deposited solder 38. The bottom portion 44 of heat slug 40 rests within opening 31 and limits the lateral movement of the heat slug throughout the PCB surface mounting process. The connection between heat slug 40 and PCB 30 is made by running the PCB through a nitrogen ambient reflow furnace. The reflow furnace temperature is adjusted above the melting temperature of solder 38 such that during reflow solder 38 is wetted onto heat slug 40 and metal layer 36 of PCB 30.

Figure 5:
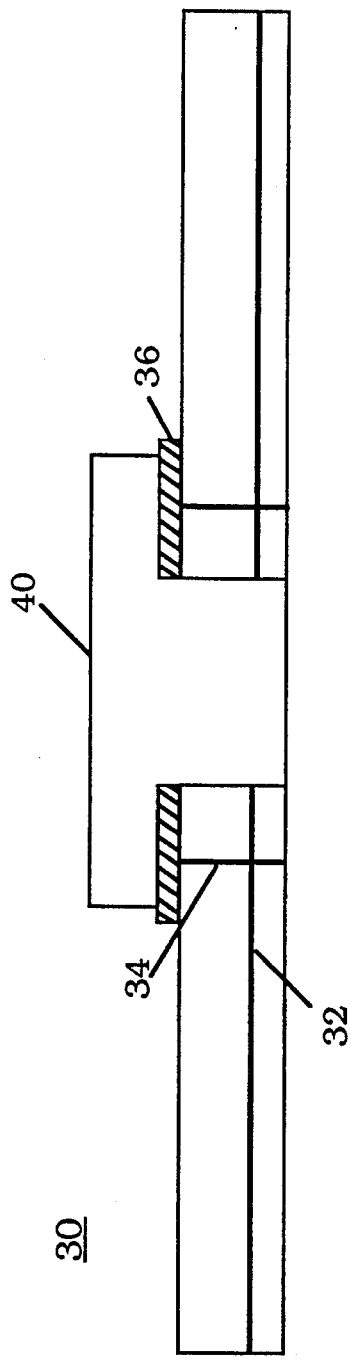
FIG. 5 illustrates the PCB of FIG. 3 after the heat slug has been placed into the opening of the PCB and reflowed.
Figure 6:
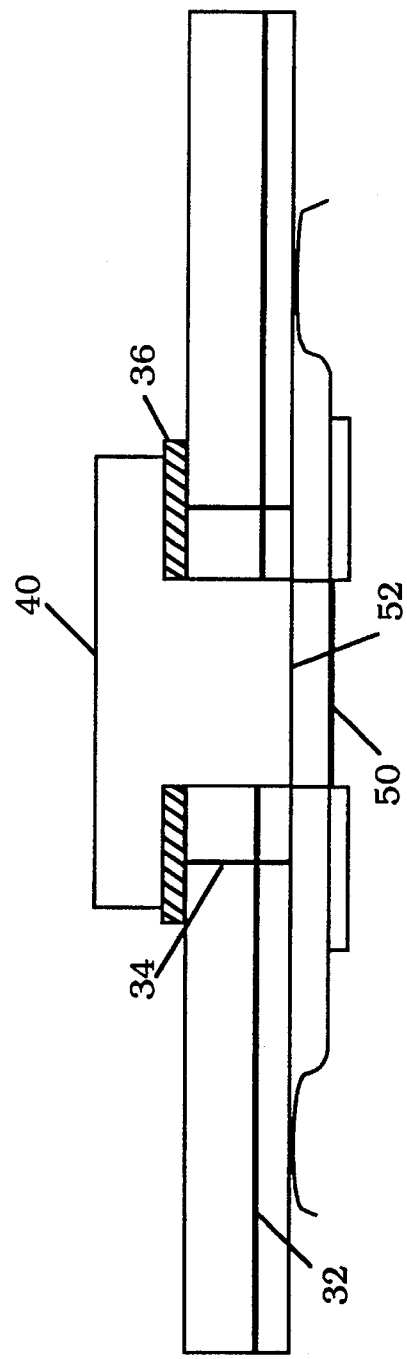
FIG. 6 illustrates the PCB of FIG. 5 after an electronic package has been attached to the PCB.

FIG. 5 shows heat slug 40 attached to PCB 30 after the surface-mount process is complete. Note that a thermal conduction path is provided between heat slug 40 and inner metal layer 32 of PCB 30. By providing a heat path to inner metal layer 32 the metal layer is able to contribute to the overall thermal mass of the unit, thereby reducing the need to attach additional heat sink fixtures to heat slug 40. FIG. 6 further illustrates the apparatus of FIG. 5 after an electronic package 50 has been surface mounted to the bottom side of PCB 30. The interface 52 between package 50 and heat slug 40 typically comprises a thermal adhesive or a thermal grease.

Solder 38 may comprise any solder composition whose properties are conducive to the manufacturing process just described. In one embodiment of the present invention solder 38 comprises a 63/37 Sn/Pb solder paste composition that contains a resin flux. In this embodiment the reflow furnace temperature is set above the reflow temperature of the solder which is approximately 220 degrees Celsius. The shaped pattern and thickness of solder 38 will vary depending upon the particular application. The thickness of solder 38 will typically vary between 0.004 to 0.005 inches. Note also that a solder paste not containing a flux may be used. It is further understood that any of a variety of methods may be used to apply solder 38 to the PCB. For example, in lieu of using a screen mesh apparatus, an extrusion method of applying solder paste may be utilized.

Although FIG. 1–3, 5 and 6 depict a PCB having peripheral vias 34 and inner metal layer 32, it should be understood that a PCB having peripheral vias and an inner metal layer is not essential to the implementation of the present invention.

In the foregoing description an embodiment of the present invention is disclosed having metal layer 36 comprising copper. It should be understood, however, that a copper layer is not essential to the implementation of the present invention, nor is the invention limited to a single metal layer. The implementation of the present invention requires only the use of a thermally conductive metal layer or metal stack that bonds to PCB 30 and heat slug 40 and is wettable with solder 38. It is important to note, however, that in some instances that the surface of PCB may already possess the essential properties required to bond the slug to the PCB. Thus, in those instances the formation of a metal layer around the periphery of opening 31 is not required.

Figure 7:
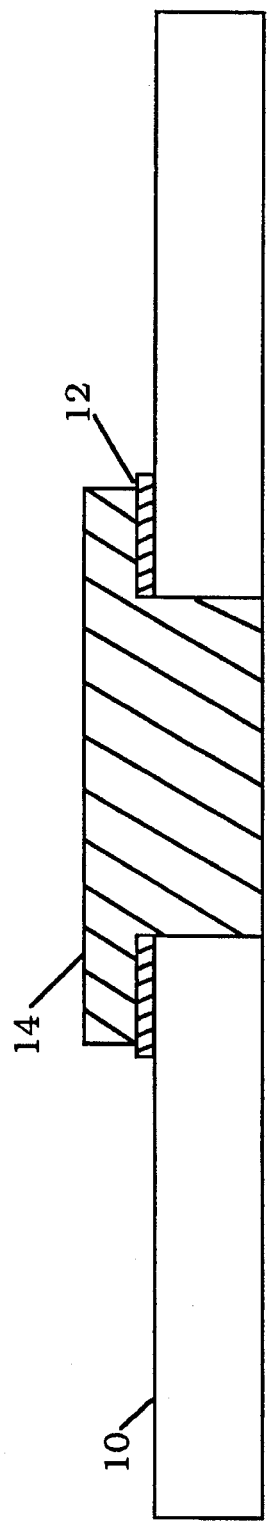
FIG. 7 illustrates the side view of another embodiment of the present invention before the apparatus is placed into a reflow or curing furnace.
Figure 8:
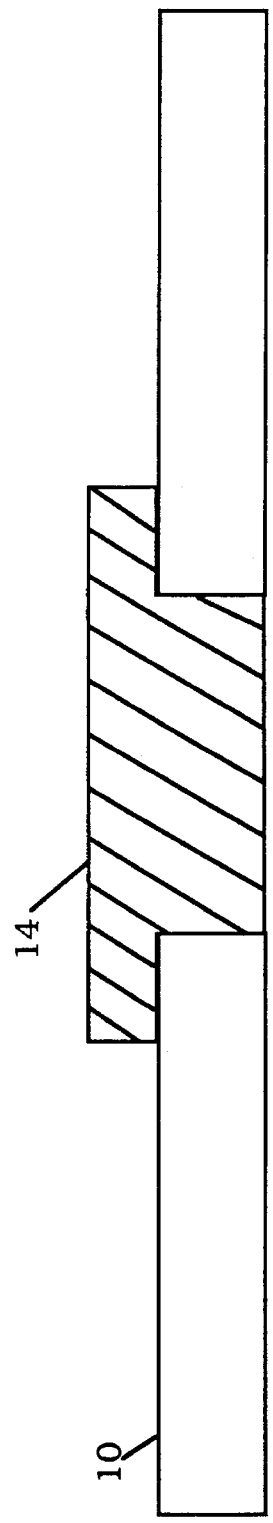
FIG. 8 illustrates the apparatus of FIG. 7 after the reflow or curing process.

FIG. 7 depicts a PCB 10 devoid of the peripheral vias of the previous embodiment. As a result, there is no need to provide a thermal conductive path between the heat slug and the inner metal layers of the PCB. Therefore, the method of installing a heat slug into opening 11 is accomplished by the following method: First, a thermal setting adhesive 12 is deposited about the periphery of opening 11. Heat slug 14 is then installed in opening 11 using a standard pick-and-place surface-mount machine in the same manner described above. The connection between heat slug 14 and PCB 10 is then made by curing the adhesive in a furnace. FIG. 7 illustrates the heat slug 14, adhesive 12, and PCB 10 configuration prior to reflow.

Adhesive 12 may comprise any adhesive whose properties are conducive to the process just described. For example, adhesive 12 may comprises a thermoset polymer such as Ablebond 8380. The thickness of adhesive 12 will vary depending upon the particular application. However, the thickness of adhesive 12 will typically vary between 0.001 and 0.002 inches. In this embodiment a curing time of approximately one minute at a temperature of approximately 150 degrees Celsius is required.

Thus, an improved method for attaching a heat slug to a PCB using surface mount technology is described. Although many alternations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, materials and process parameters set forth within the specification are exemplary of the disclosed embodiments only. Other embodiments may utilize different dimensions, shapes, materials, and process steps, etc., to achieve substantially the same results.

What is claimed is:

1. An apparatus for cooling an integrated circuit package comprising:

a printed circuit board having a top surface, a bottom surface, at least one metal layer disposed between said top and bottom surfaces, a through opening extending from said top surface to said bottom surface, and a plurality of vias disposed around the periphery of said through opening that are filled with a thermally conductive metal, said vias extending from said top surface to said metal layer; and a heat slug surface mounted into said through opening of said printed circuit board, said heat slug comprising a top portion, a bottom portion, and a ledge located between said top and bottom portions supporting said heat slug in said through opening, said ledge being attached to said top surface of said printed circuit board such that a thermal conduction path is established between said heat slug and said vias, said bottom portion of said heat slug having a bottom surface for mounting said integrated circuit package.

2. The apparatus of claim 1 further comprising a thermally conductive metal layer disposed between said ledge and said top surface of said printed circuit board, said conductive metal layer covering said vias.

3. The apparatus of claim 1 wherein said heat slug and said printed circuit board possess substantially the same coeffficient of thermal expansion.

4. The apparatus of claim 1 wherein said heat slug comprises a thermally and electrically conductive material.

5. The apparatus of claim 1 wherein said heat slug comprises copper.

6. The apparatus of claim 1 wherein said top portion has a top surface having a shape that allows said heat slug to be placed into said through opening using a vacuum manipulator on an electronic assembly pick-and-place machine.

7. The apparatus of claim 6 wherein said top surface of said heat slug comprises a flat surface.

* * * * *